United States Patent [19]

Yatabe

[11] Patent Number: 4,936,328
[45] Date of Patent: Jun. 26, 1990

[54] WAFER TRANSPOSING DEVICE
[75] Inventor: Yasuo Yatabe, Tokyo, Japan
[73] Assignee: Tomco, Mfg., Ltd., Tokyo, Japan
[21] Appl. No.: 287,024
[22] Filed: Dec. 21, 1988
[30] Foreign Application Priority Data
  Sep. 28, 1988 [JP]   Japan .......................... 63-125643[U]
[51] Int. Cl.⁵ ............................................... B08B 3/04
[52] U.S. Cl. ..................................... 134/66; 118/500; 134/76; 134/82
[58] Field of Search ....................... 134/66, 76, 82, 83; 118/500

[56]          References Cited
         U.S. PATENT DOCUMENTS 3,106,927  10/1963  Madwed ............................... 134/76
  4,282,825   8/1981  Nagatomo et al. ............... 134/66 X
  4,715,392  12/1987  Abe et al. .......................... 134/66 X
  4,722,752   2/1988  Steck ................................. 134/140 X
  4,736,758   4/1988  Kusuhara ............................... 134/66
  4,736,759   4/1988  Coberly et al. ....................... 134/66
  4,777,970  10/1988  Kusuhara ............................... 134/66

Primary Examiner—Philip R. Coe

[57]                ABSTRACT

A wafer transporting device for transposing and transferring wafers charged in at least two first carriers to second carriers, including a wafer holding device provided with a holder for holding the wafers which are removed from the first carriers and a wafer transferring device for removing the wafers charged in the first carriers by one stroke, thereby improving the working efficiency in a semiconductor manufacturing system.

4 Claims, 5 Drawing Sheets

WAFER TRANSPOSING DEVICE

BACKGROUND OF THE INVENTION

1. Field of the Invention

The present invention relates to a wafer transposing device for transposing a wafer such as a semiconductor wafer and a silicon wafer charged in one carrier to another carrier.

2. Description of the Prior Art

Normally, such a wafer is charged in a carrier made of plastic, and when the wafer is to be treated by a semiconductor manufacturing device, it must be charged in a carrier made of a heat resisting material, such as quartz glass. In transposing the wafer from the plastic carrier to the quartz glass carrier, a wafer transposing device is normally used.

A conventional wafer transposing device is disclosed in Japanese Patent Laid-Open Publication No. 61-131465, for example, wherein the device includes a lifting member for lifting the wafer and a holding member for holding the wafer.

However, in the conventional wafer transposing device, the wafers charged in two or more carriers cannot be transposed in one stroke, resulting in a low working efficiency.

SUMMARY OF THE INVENTION

The present invention has been achieved to solve the above problem in the prior art, and it is an object of the present invention to provide a wafer transposing device which may improve the working efficiency.

According to the present invention there is provided a wafer transposing device for transposing wafers charged in at least two first carriers to a second carrier or holder, comprising a wafer holding device provided with a holder for holding the wafers only out of the first carrier.

Accordingly, the wafers charged in at least two carriers can be transposed in one stroke, thereby improving the working efficiency in a semiconductor manufacturing step.

Other objects and features of the invention will be more fully understood from the following detailed description and appended claims when taken with the accompanying drawings.

DETAILED DESCRIPTION OF THE PREFERRED EMBODIMENT

Figure 1:
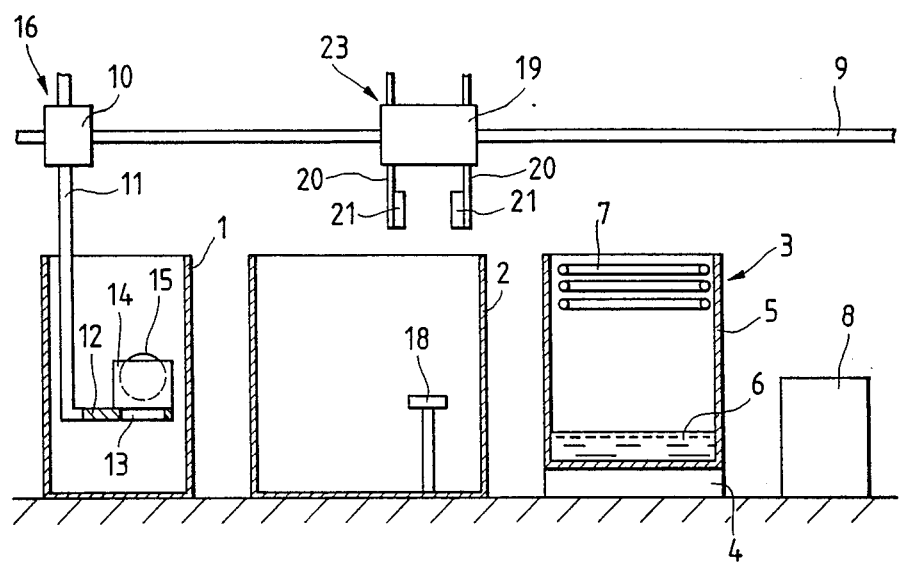
FIG. 1 is a schematic illustration of the wafer washing and drying apparatus including the wafer transposing device of a preferred embodiment according to the present invention.
Figure 2:
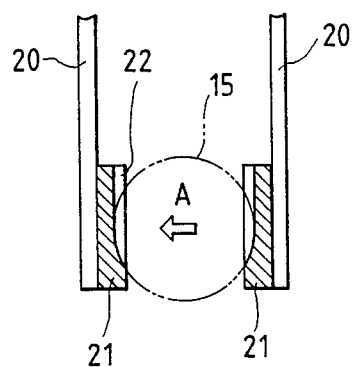
FIG. 2 is a sectional view of the essential part of the wafer washing and drying apparatus shown in FIG. 1.
Figure 3:
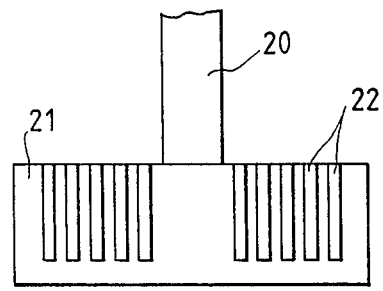
FIG. 3 is a side view as viewed in the direction of the arrow A in FIG. 2.
Figure 4:
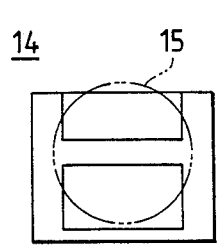
FIG. 4 is an elevational view of the carrier employed in the wafer washing and drying apparatus shown in FIG. 1.
Figure 5:
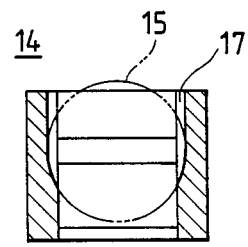
FIG. 5 is a sectional view in elevation of the carrier.
Figure 6:
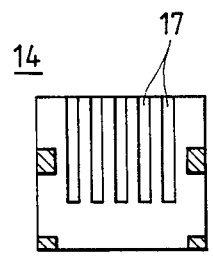
FIG. 6 is a sectional view inside of the carrier.
Figure 7:
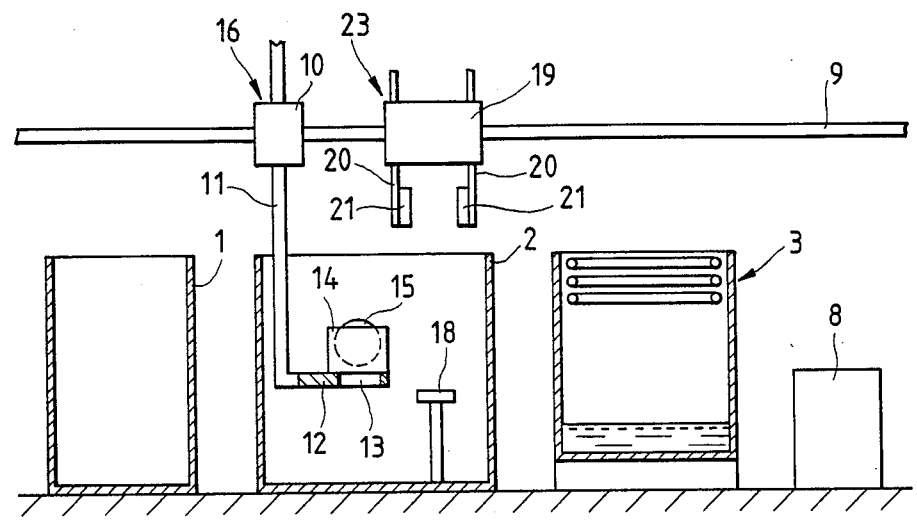
FIGS. 7 to 12 are schematic illustrations of the operation of the wafer washing and drying apparatus including the wafer transposing device as shown in FIG. 1.

There will now be described a preferred embodiment of the wafer washing and drying apparatus including the wafer transposing device according to the present invention with reference to the drawings.

Referring to FIGS. 1 to 6, the wafer washing and drying apparatus includes a chemical cleaning bath 1, a rinse bath 2, an organic vapor drier 3, a heater 4 for the organic vapor drier 3, a drying bath 5 for the organic vapor drier 3, an organic solvent 6, such as isopropyl alcohol reserved in the drying bath 5, a cooling pipe 7 provided in an upper portion of the drying bath 5, a carrier table 8 for mounting thereon carrier charging wafers after being dried, a guide 9 provided over the chemical cleaning bath 1, the rinse bath 2 and the organic vapor drier 3, a lift 10 horizontally movably mounted to the guide 9, a lift arm 11 vertically movably mounted to the lift 10, a carrier mounting member 12 provided at a lower portion of the lift arm 11, and a hole 13 formed through the carrier mounting member 12. The lift 10, the lift arm 11 and the carrier mounting member 12 constitute a transporter 16. Two carriers 14 made of resin, glass or metal are placed on the carrier mounting member 12. Each carrier 14 is formed with a plurality of slits 17 for receiving wafers 15 therein.

A wafer holding device 23 comprises a moving member 19 horizontally movably mounted to the guide 9, a pair of holder arms 20 vertically movably and adjustably mounted to the moving member 19, and a pair of holders 21 mounted at opposing lower ends of the holder arms 20. A push-up table 18 is provided in the rinse bath 2. The holders 21 have a heat capacity smaller than that of the carriers 14. Each holder 21 is formed with a plurality of slits 22 for receiving the wafers 15 therein. The number of the slits 22 is twice the number of the slits 17 of each carrier 14.

Figure 8:
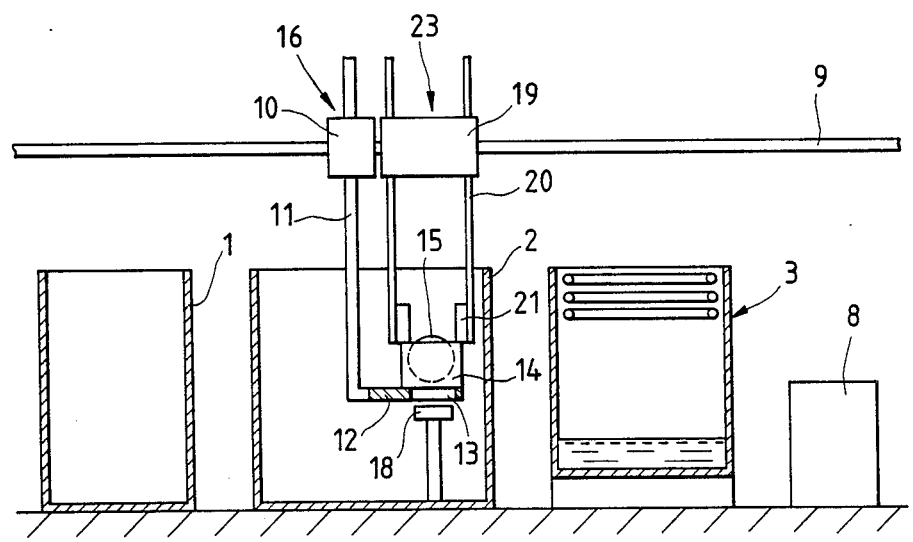
Figure 9:
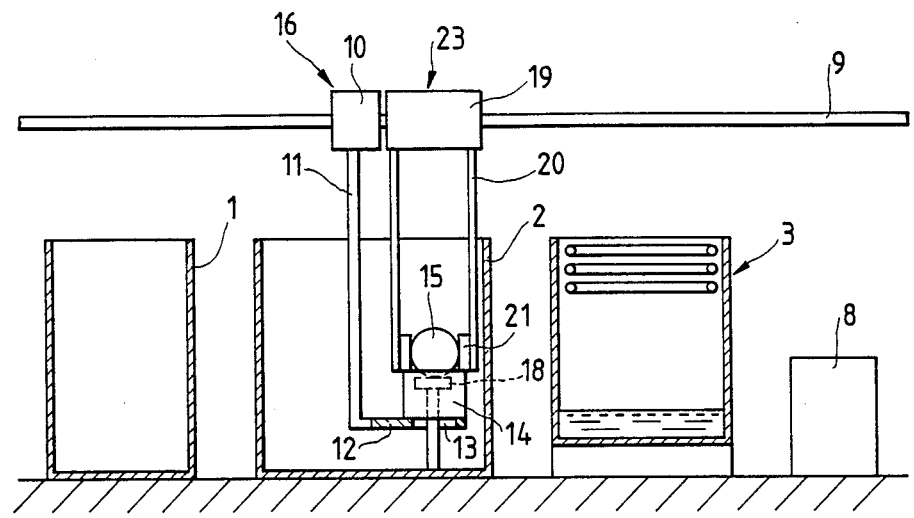
Figure 10:
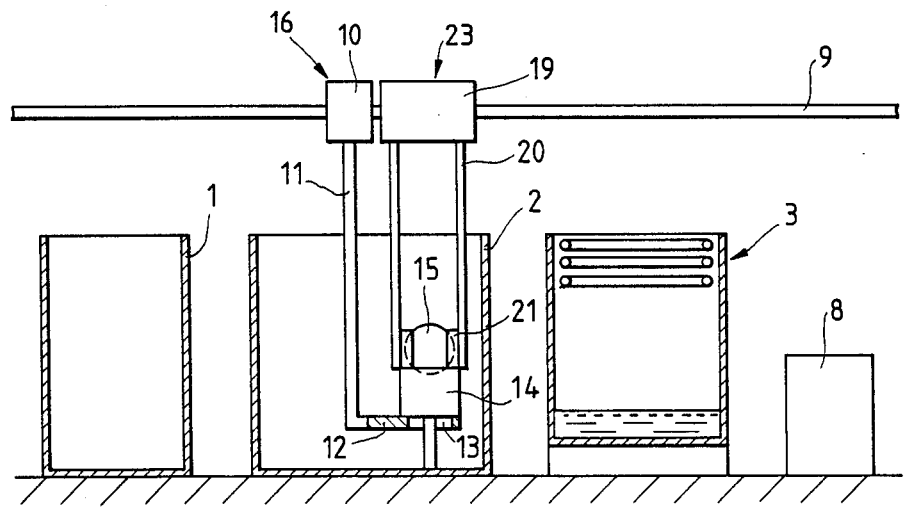
Figure 11:
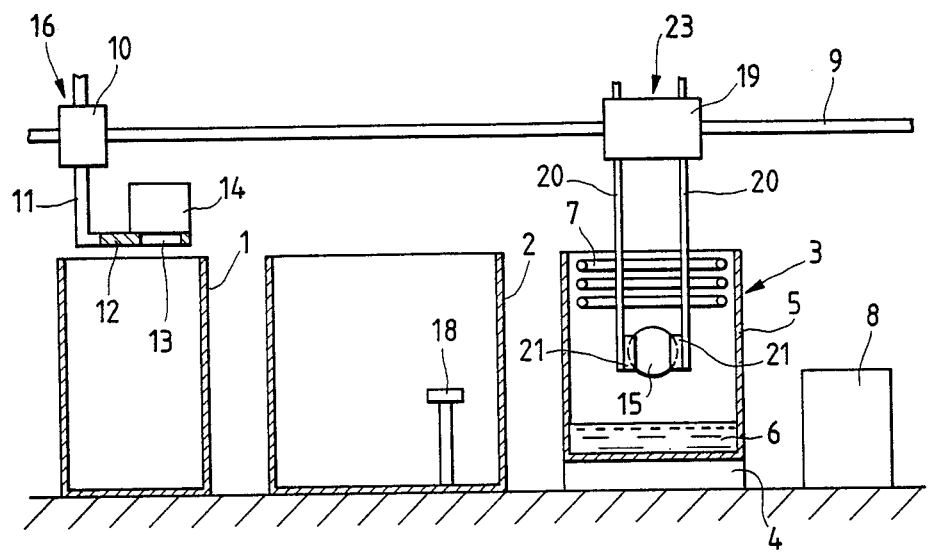
Figure 12:
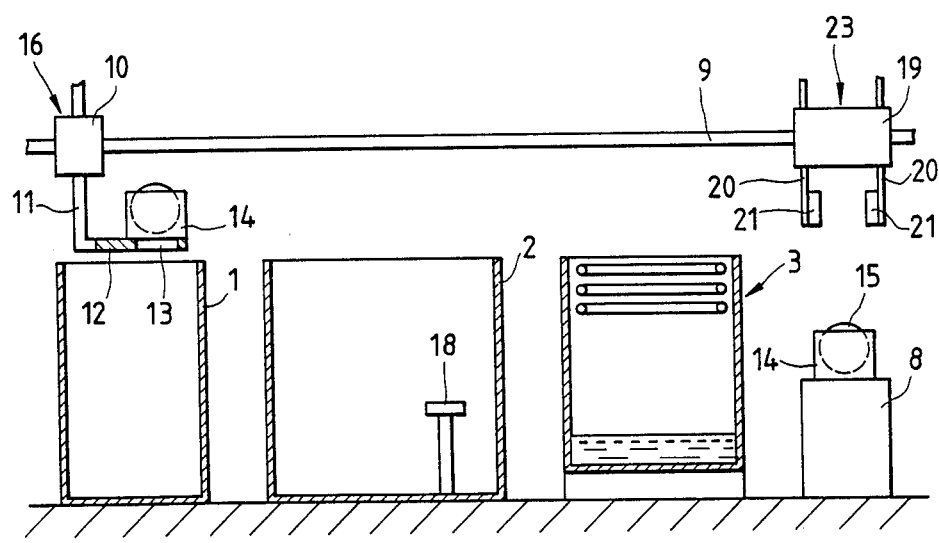

In operation, as shown in FIG. 1, the wafers 15 set in the two carriers 14 are dipped in the chemical cleaning bath 1, and are cleaned by an acid or alkali reserved in the chemical cleaning bath 1. Then, as shown in FIGS. 7-12, the wafers 15 are transported into the rinse bath 2 by the transporter 16, and are washed by pure water or the like reserved in the rinse bath 2. Then, as shown in FIG. 8, the wafers 15 are moved to a position above the push-up table 18 by the transporter 16. At the same time, the holders 21 are lowered until the lower ends of the holders 21 come into contact with the upper ends of the carriers 14. Then, as shown in FIG. 9, the holders 21 and the carriers 14 are lowered together. As a result, the wafers 15 only are pushed up by the push-up table 18. Then, as shown in FIG. 10, the holders 21 are closed by the holder arms 20 to hold the wafers 15. Then, as shown in FIG. 11, the wafers 15 held by the holders 21 are transported by the wafer holding device 23 into the organic vapor drier 3 suspended between the organic solvent 6 and the cooling pipe 7, and are dried in the organic vapor drier 3 under the condition whereby they are held by the holders 21 having a small heat capacity. Then, as shown in FIG. 12, the wafers 15 are further transported by the wafer holding device 23 to a position over two other carriers 14 mounted on the carrier table 8, and are set into the carriers 14.

As described above, the wafers 15 set in the two carriers 14 are transferred to the holders by one stroke, and are then dried by the vapor of the organic solvent, thereby improving the working efficiency. Further, the wafers 15 are dried by the vapor of the organic solvent 6 under the condition whereby they are held by the holders 21 of the wafer holding device 23. That is, the wafers 15 are dried without using the carriers 14. Since the heat capacity of the holders 21 is smaller than that of the carriers 14, the vapor of the organic solvent 6 is hardly cooled by the holders 21 when the wafers 15 are dried between the organic solvent 6 and the cooling pipe 7 in the organic vapor drier 3. Accordingly, the wafers 15 can be quickly dried by the vapor, thereby avoiding the generation of stain such as water marks. Further, a quantity of the organic solvent 6 to be consumed can be reduced to thereby improve the economy and ensure the safety. Further, energy consumption of the heater 4 can be also reduced to thereby improve the economy. Even when the liquid chemical in the cleaning bath 1 is deposited onto or penetrates into the carriers 14, the liquid chemical is prevented from attaching to the wafers 15 in the drying step, thereby avoiding the generation of water marks or the like on the wafers 15. Furthermore, as the wafers 15 are transported from the carriers 14 to the holders 21 in the rinse bath 2, the time required for transporting the wafers 15 from the rinse bath 2 to the organic vapor drier 3 can be greatly reduced. Therefore, the generation of water marks or the like can be prevented after the wafers 15 are dried in the organic vapor drier 3. Additionally, in transferring the wafers 15 from the carriers 14 to the holders 21, the carriers 14 and the holders 21 are lowered together to lift the wafers 15 by means of the push-up table 18. That is, the wafers 15 can be transferred without the need of vertically moving the push up table 18, thereby preventing contamination of the liquid in the rinse bath 2.

Although the wafers 15 are held by the wafer holding device 23 in the wafer in transferring the same from the carriers 14 to the holders 21 in the preferred embodiment, the wafers 15 may be held in the air according to the present invention. Although the transporter 16 is constructed of the lift 10, the lift arm 11 and the carrier mounting member 12 in the preferred embodiment, any other suitable transporter may be used according to the present invention. Although the wafer holding device 23 is constructed of the moving member 19, the holder arms 20 and the holders 21 in the preferred embodiment, any other suitable wafer holding device may be used according to the present invention. Although the number of the slits 22 of each holder 21 is twice the number of the slits 17 of each carrier 14 in the preferred embodiment, the former may be thrice or more the latter according to the present invention. Although the push-up table 18 is fixedly provided in the rinse bath 2 in the preferred embodiment, it may be vertically movably provided in the rinse bath 2.

In summary, according to the present invention, as the wafers charged in at least two carriers can be transposed or transferred by one stroke to the holders 21, the working efficiency is improved.

While the invention has been described with reference to specific embodiments, the description is illustrative and is not to be construed as limiting the scope of the invention. Various modifications and changes may occur to those skilled in the art without departing from the spirit and scope of the invention as defined by the appended claims.

What is claimed is:

1. A wafer washing and drying apparatus including a wafer transporting and transferring configuration comprising in combination:

a chemical cleaning bath for cleaning wafers set in slits formed in at least two first carriers;

a rinse bath for rinsing liquid cleaning chemicals from said wafers;

an organic vapor drier for drying said wafers in contact with a vapor flow of an organic solvent;

a wafer transferring means provided in said rinse bath;

a means for transporting said at least two carriers with said wafers from said chemical cleaning bath to said rinse bath to a position above said wafer transferring means, said transporting means including a horizontally movable lift positioned above said washing and drying apparatus, a lift arm vertically movable within said lift having a carrier mounting member provided at a lower portion thereof for supporting said at least two first carriers, said carrier mounting member having a hole formed therethrough; and a wafer holding device including a horizontally movable member positioned above said washing and drying apparatus, a pair of holder arms vertically movable within and adjustably mounted to said movable member and a pair of opposing wafer holders mounted at lower ends of said holder arms, each holder being provided with a plurality of slits for receiving said wafers upon transfer from said at least two first carriers by said wafer transferring means, said wafer holding device thereafter transporting said wafers from said rinse bath to said vapor drier and then to at least two second carriers having slits formed therein for receipt of said wafers from said wafer holders.

2. The wafer washing and drying apparatus as in claim 1, wherein said wafer holders have a heat capacity smaller than that of said at least two carriers.

3. The wafer washing and drying apparatus as in claim 1, wherein said transferring means comprises a push-up table and said hole formed in said mounting member of said transporting means is of such a size which permits passage therethrough of said push-up table.

4. The wafer washing and drying apparatus as in claim 1, wherein the number of slits formed in said wafer holders is twice the number of slits formed in each of said at least two carriers.

* * * * *